(12) United States Patent
Zhong

(10) Patent No.: US 10,020,734 B2
(45) Date of Patent: Jul. 10, 2018

(54) AUTO CALIBRATION METHOD USED IN CONSTANT ON-TIME SWITCHING CONVERTER

(71) Applicant: Chengdu Monolithic Power Systems Co., Ltd., Chengdu (CN)

(72) Inventor: Changxian Zhong, Chengdu (CN)

(73) Assignee: Chengdu Monolithic Power Systems Co., Ltd. (CN)

( * ) Notice: Subject to any disclaimer, the term of this patent is extended or adjusted under 35 U.S.C. 154(b) by 0 days.

(21) Appl. No.: 15/633,688

(22) Filed: Jun. 26, 2017

(65) Prior Publication Data

US 2018/0006564 A1 Jan. 4, 2018

(30) Foreign Application Priority Data

Jun. 29, 2016 (CN) .......................... 2016 1 0505794

(51) Int. Cl.
| | |
|---|---|
| *G05F 1/00* | (2006.01) |
| *H02M 3/156* | (2006.01) |
| *H02M 3/158* | (2006.01) |
| *H04W 76/04* | (2009.01) |
| *H03K 17/16* | (2006.01) |
| *H03M 1/80* | (2006.01) |
| *H03M 1/52* | (2006.01) |
| *H03M 1/10* | (2006.01) |
| *H04W 76/23* | (2018.01) |
| *H02M 1/00* | (2006.01) |

(52) U.S. Cl.
CPC ............ *H02M 3/158* (2013.01); *H03K 17/16* (2013.01); *H03M 1/1023* (2013.01); *H03M 1/52* (2013.01); *H03M 1/804* (2013.01); *H04W 76/043* (2013.01); *H04W 76/23* (2018.02); *H02M 2001/0032* (2013.01)

(58) Field of Classification Search
CPC ........ H02M 1/08; H02M 1/088; H02M 1/096; H02M 3/142; H02M 3/155; H02M 3/156; H02M 3/157; H02M 3/158
USPC ....... 323/242, 243, 266, 283–285, 288, 322, 323/323, 326, 351
See application file for complete search history.

(56) References Cited

U.S. PATENT DOCUMENTS

| | | | | |
|---|---|---|---|---|
| 2010/0072962 A1* | 3/2010 | Lin | ....................... | H02M 3/156 323/282 |
| 2013/0241511 A1* | 9/2013 | Xi | ......................... | H02M 3/158 323/283 |
| 2013/0257399 A1* | 10/2013 | Jiang | ........................ | G05F 1/10 323/271 |

(Continued)

*Primary Examiner* — Gary Nash
(74) *Attorney, Agent, or Firm* — Perkins Coie LLP

(57) ABSTRACT

An auto calibration method used in switching converters with constant on-time control. The auto calibration method includes: generating a periodical clock signal with a predetermined duty cycle; providing a first voltage and a second voltage to an on-time control circuit to generate an on-time control signal based on the first and second voltage; providing the clock signal and on-time control signal to a logic circuit to generate a switch control signal based on the clock signal and on-time control signal; comparing the duty cycle of the switch control signal with the duty cycle of the clock signal to adjust a calibration code signal; and adjusting circuit parameters of the on-time control circuit in accordance with the calibration code signal.

20 Claims, 8 Drawing Sheets

(56) References Cited

U.S. PATENT DOCUMENTS

| | | | |
|---|---|---|---|
| 2014/0035654 A1* | 2/2014 | Jiang | H03K 17/16 327/365 |
| 2014/0062434 A1* | 3/2014 | Ouyang | H02M 3/156 323/271 |
| 2014/0160601 A1* | 6/2014 | Ouyang | H02M 3/158 361/18 |
| 2014/0285170 A1 | 9/2014 | Deng | |
| 2014/0354250 A1 | 12/2014 | Deng | |
| 2016/0190931 A1 | 6/2016 | Zhang | |
| 2016/0315535 A1 | 10/2016 | Ouyang | |

* cited by examiner

AUTO CALIBRATION METHOD USED IN CONSTANT ON-TIME SWITCHING CONVERTER

CROSS-REFERENCE TO RELATED APPLICATIONS

This application claims the benefit of CN application 201610505794.6, filed on Jun. 29, 2016, and incorporated herein by reference.

TECHNICAL FIELD

The present invention generally relates to electronic circuits, and more particularly but not exclusively to constant on-time switching converters and control methods thereof.

BACKGROUND

COT (constant on-time) control method is widely used in power supply area due to its simple structure and excellent transient response.

FIG. 1 illustrates a schematic of a prior COT switching converter, wherein based on the input voltage Vin and output voltage Vout, an on-time control signal COT is generated by the on-time control circuit to determine the on-time of the high side transistor M1. The comparing circuit compares the output voltage Vout with a reference voltage Vref to provide a comparison signal SET. In accordance with the on-time control signal COT and the comparison signal SET, the logic circuit generates a switch control signal CTRL to control the high side transistor M1 and low side transistor M2. Generally, when the output voltage Vout decreases to be smaller than the reference voltage Vref, the transistor M1 turns on and the transistor M2 turns off. When the on-time of M1 reaches a time threshold determined by the on-time control circuit, the transistor M1 turns off and the transistor M2 turns on.

During mass production, the on-time control circuit is inevitably influenced by manufacture tolerance (e.g., tolerance on resistance, capacitance and comparator delay), which leads to different on-time for converters with same circuit design and work condition. Therefore, the product consistency is harmed.

SUMMARY

Embodiments of the present invention are directed to an auto calibration method used in switching converters with constant on-time control, wherein the switching converter is configured to convert an input voltage into an output voltage, and is configured to include a main transistor, an on-time control circuit determining the on-time of the main transistor, and a logic circuit driving the main transistor. The auto calibration method comprises: generating a periodical clock signal with a predetermined duty cycle; providing a first voltage and a second voltage to the on-time control circuit to generate an on-time control signal based on the first and second voltage; providing the clock signal and on-time control signal to the logic circuit to generate a switch control signal based on the clock signal and on-time control signal; comparing the duty cycle of the switch control signal with the duty cycle of the clock signal to adjust a calibration code signal; and adjusting circuit parameters of the on-time control circuit in accordance with the calibration code signal.

Embodiments of the present invention are also directed to a controller used in a switching converter with constant on-time control, wherein the switching converter includes a main transistor, and is configured to convert an input voltage into an output voltage. The controller comprises: an oscillator configured to generate a periodical clock signal with a predetermined duty cycle; an on-time control circuit having a first input terminal, a second input terminal, a third input terminal and an output terminal, wherein the first input terminal is configured to receive a first voltage, the second input terminal is configured to receive a second voltage, and wherein based on the first and second voltage, the on-time control circuit generates an on-time control signal at the output terminal to determine the on-time of the main transistor; a logic circuit having a first input terminal, a second input terminal and an output terminal, wherein the first input terminal is coupled to the output terminal of the on-time control circuit, the second input terminal is coupled to the oscillator to receive the clock signal, and wherein based on the on-time control signal and the clock signal, the logic circuit generates a switch control signal at the output terminal to drive the main transistor; and a duty cycle detection circuit having a first input terminal, a second input terminal and an output terminal, wherein the first input terminal is coupled to the oscillator, the second input terminal is coupled to the output terminal of the logic circuit, the output terminal is coupled to the third input terminal of the on-time control circuit, and wherein the duty cycle detection circuit compares the duty cycle of the switch control signal with the duty cycle of the clock signal, and generates a calibration code signal at the output terminal to adjust circuit parameters of the on-time control circuit.

Embodiments of the present invention are further directed to a switching converter with constant on-time control, comprising: a first transistor having a first terminal, a second terminal and a control terminal, wherein the first terminal is configured to receive an input voltage; a second transistor having a first terminal, a second terminal and a control terminal, wherein the first terminal is coupled to the second terminal of the first transistor, the second terminal is coupled to a reference ground; an inductor having a first terminal and a second terminal, wherein the first terminal is coupled to the second terminal of the first transistor and the first terminal of the second transistor, the second terminal is configured to provide an output voltage; an oscillator configured to generate a periodical clock signal with a predetermined duty cycle; an on-time control circuit having a first input terminal, a second input terminal, a third input terminal and an output terminal, wherein the first input terminal is configured to receive a first voltage, the second input terminal is configured to receive a second voltage, and wherein based on the first and second voltage, the on-time control circuit generates an on-time control signal at the output terminal; a logic circuit coupled to the oscillator and the output terminal of the on-time control circuit, wherein based on the on-time control signal and the clock signal, the logic circuit generates a switch control signal drive the first and second transistors; and a duty cycle detection circuit coupled to the oscillator, the logic circuit and the third input terminal of the on-time control circuit, wherein the duty cycle detection circuit compares the duty cycle of the switch control signal with the duty cycle of the clock signal, and generates a calibration code signal to adjust circuit parameters of the on-time control circuit.

BRIEF DESCRIPTION OF THE DRAWING

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
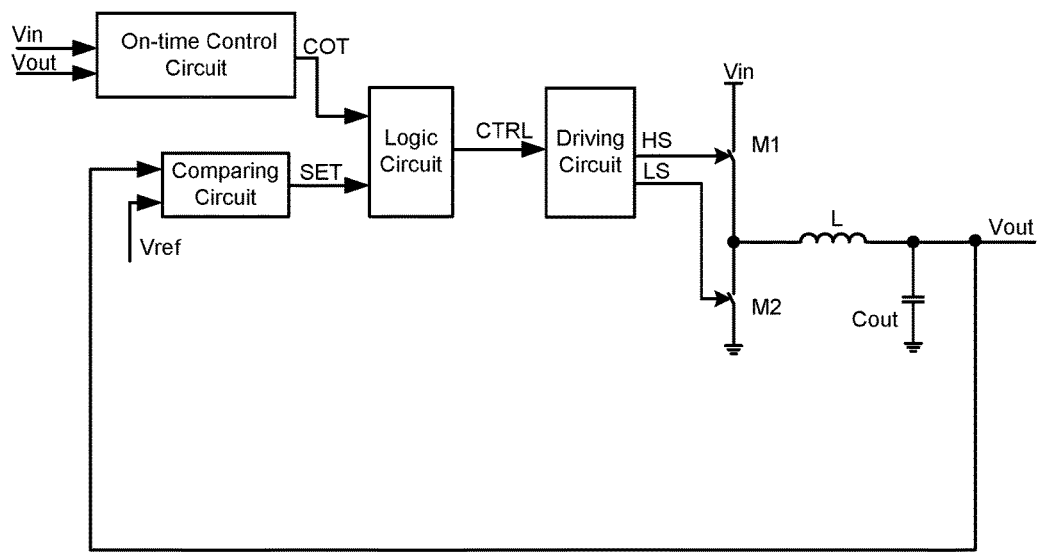
FIG. 1 schematically illustrates of a prior COT switching converter.
Figure 2:
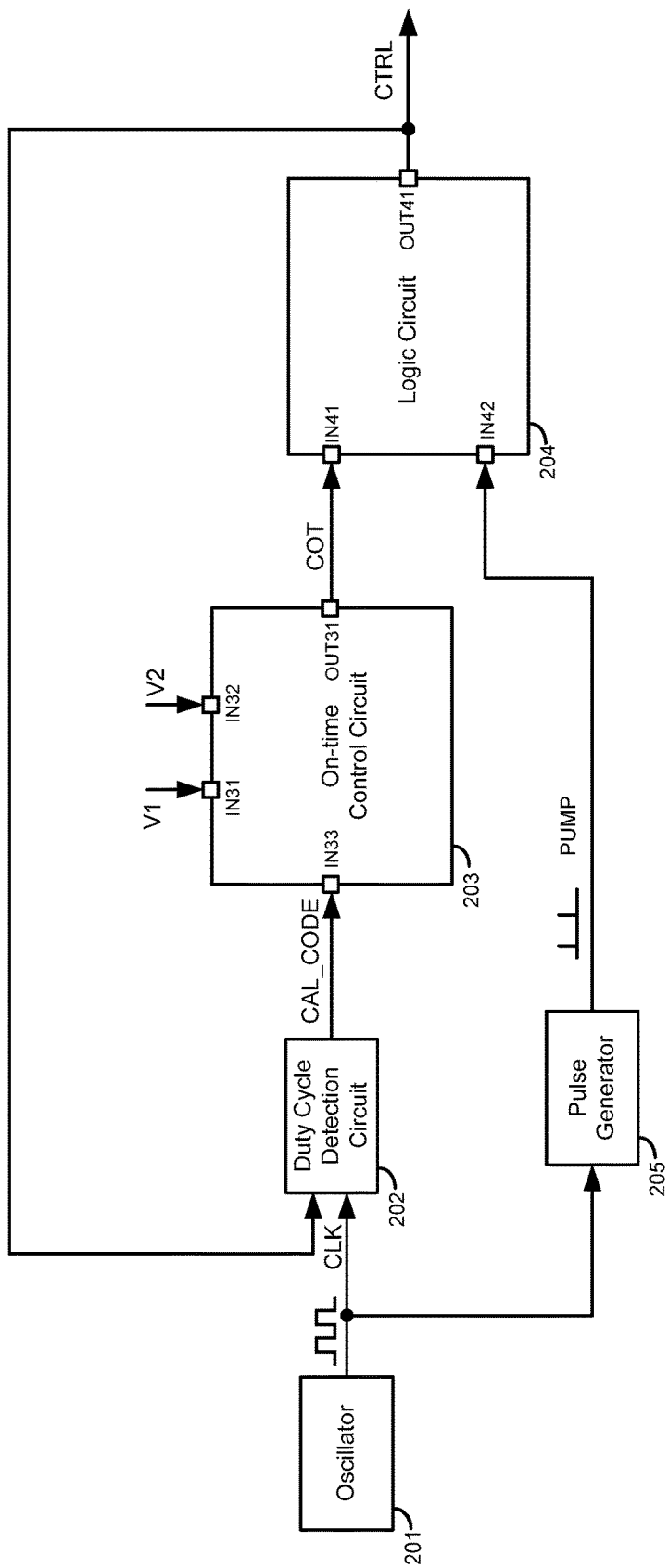
FIG. 2 schematically illustrates an on-time auto calibration system in accordance with an embodiment of the present invention.

FIG. 2 schematically illustrates an on-time auto calibration system in accordance with an embodiment of the present invention. It includes an oscillator 201, a duty cycle detection circuit 202, an on-time control circuit 203, a logic circuit 204 and a pulse generator 205. The oscillator 201 is configured to generate a periodical clock signal CLK with a predetermined duty cycle Dset (e.g. 50%). The on-time control circuit 203 has three input terminal IN31-IN33 and an output terminal OUT31. Compared with the prior art shown in FIG. 1, this on-time control circuit 203 also provides an on-time control signal COT at its output terminal OUT31 to determine the on-time of the main transistor (e.g. M1). But instead of the input voltage Vin and output voltage Vout, voltage V1 and V2 are respectively provided to the input terminals IN31 and IN32.

The pulse generator 205 has an input terminal and an output terminal, wherein the input terminal is coupled to the oscillator 201 to receive the clock signal CLK, and wherein based on the clock signal CLK, the pulse generator 205 generates a pulse signal PUMP which is synchronous with the clock signal CLK.

The logic circuit 204 has input terminals IN41, IN42 and an output terminal OUT41, wherein the input terminal IN41 is coupled to the output terminal OUT31 of the on-time control circuit 203, the input terminal IN42 is coupled to the output terminal of the pulse generator 205. Based on the on-time control signal COT and the pulse signal PUMP, the logic circuit 204 generates a switch control signal CTRL at the output terminal OUT41. Generally, the switch control signal CTRL is turned into logical high to turn on the main transistor at the rising edge of the pulse signal PUMP, and is turned into logical low to turn off the main transistor at the rising edge of the on-time control signal COT.

The duty cycle detection circuit 202 has a first input terminal, a second input terminal and an output terminal, wherein the first input terminal is coupled to the oscillator 201, the second input terminal is coupled to the output terminal OUT41 of the logic circuit 204, the output terminal is coupled to the input terminal IN33 of the on-time control circuit 203. The duty cycle detection circuit 202 compares the duty cycle D of the switch control signal CTRL with the duty cycle Dset of the clock signal CLK, and generates a calibration code signal CAL_CODE at the output terminal to adjust circuit parameters of the on-time control circuit 203. The circuit parameters could include resistance, capacitance, comparator delay, etc.

In some embodiments, the calibration code signal CAL_CODE is a digital signal. The duty cycle detection circuit 202 compares the duty cycle D of the switch control signal CTRL with Dset in each period of the clock signal CLK. If the duty cycle D is detected to be smaller than Dset, the calibration code signal CAL_CODE will be adjusted by one LSB (least significant bit) to change the circuit parameters of the on-time control circuit 203, so as to increase the duty cycle D of the switch control signal CTRL. The adjustment is stopped when the duty cycle D has been increased to reach Dset, and the circuit parameters of the on-time control circuit 203 is therefore fixed afterwards. The comparison between D and Dset could be realized through detecting the falling edges of the switch control signal CTRL and clock signal CLK. And the comparison result is evaluated at each falling edge of the clock signal CLK to determine whether to adjust the calibration code signal CAL_CODE.

Through auto adjustment of the circuit parameters, influence caused by manufacture tolerance in mass production is eliminated. The on-time of the main transistor becomes uniformed under same circuit design and work condition, thus the product consistence is enhanced.

Figure 3:
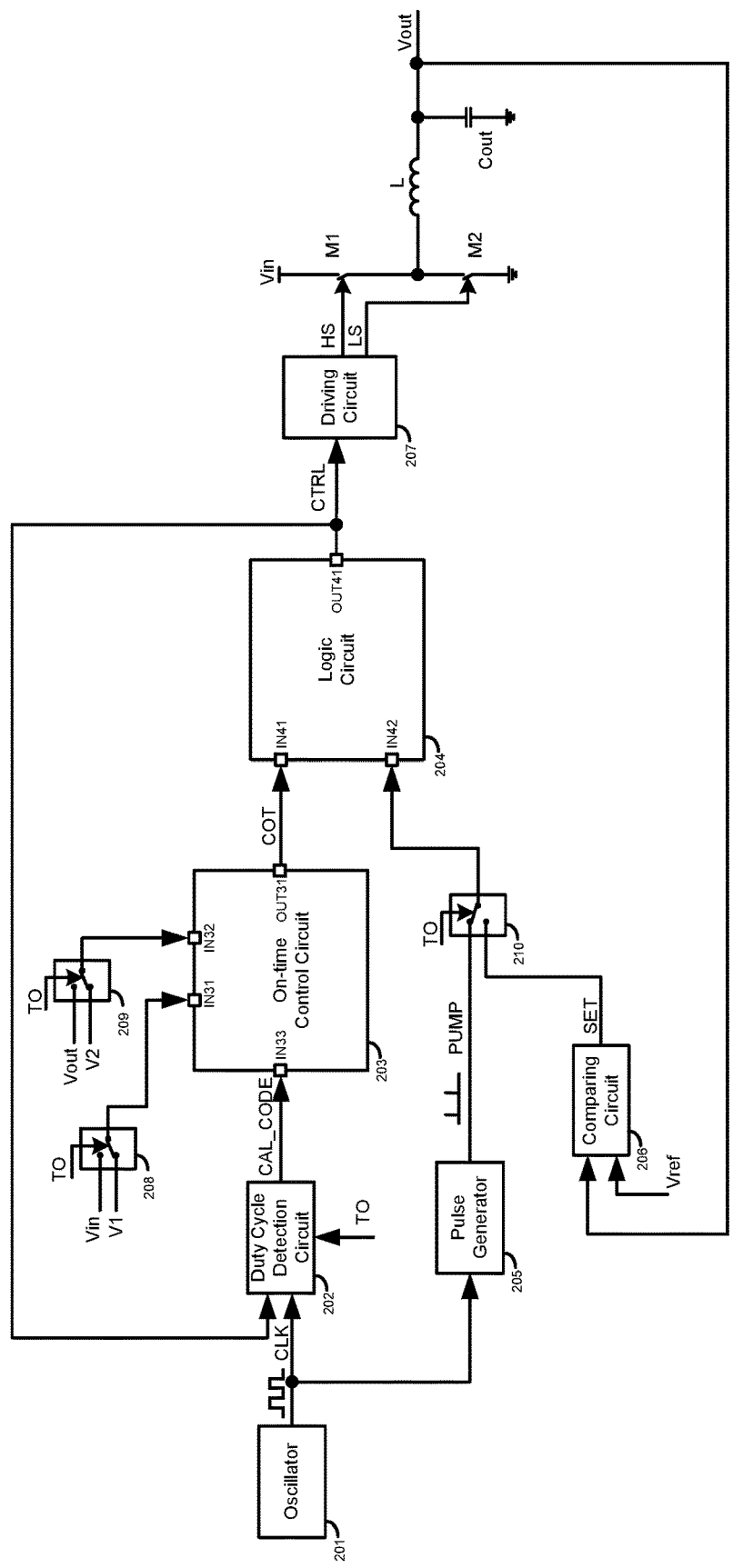
FIG. 3 illustrates a block diagram of a switching converter in accordance with an embodiment of the present invention.

This on-time auto calibration procedure can be normally conducted when the switching converter is just powered on. And once it has been finished, the circuit parameters of the on-time control circuit 203 are no longer changed, and the switching converter enters into its normal operation. FIG. 3 illustrates a block diagram of a switching converter in accordance with an embodiment of the present invention. Besides those already shown in FIG. 2, a comparing circuit 206, a driving circuit 207, transistors M1, M2, an inductor L, a capacitor Cout and multiplexers 208-210 are further provided in FIG. 3. The comparing circuit 206 is configured to compare the output voltage Vout with a reference voltage Vref to generate a comparison signal SET. In some embodiments, the output voltage Vout is divided through resistor divider ahead of being sent into the comparing circuit 206. The multiplexers 208-210 are utilized for signal selection under the control of a signal T0 which is indicative of the startup time (time from being powered on) of the switching converter.

The switching converter works in an auto calibration mode when it is just powered on. The multiplexers 208-210 respectively provide V1, V2 and the pulse signal PUMP to their output terminals. The on-time control circuit 203 generates the on-time control signal COT in accordance with the voltage V1 and V2, while based on this on-time control signal COT and the pulse signal PUMP, the logic circuit 204 provides the switch control signal CTRL. In this mode, the transistors M1 and M2 are both off and the output voltage Vout has not been established. The duty cycle detection circuit 202 compares the duty cycle D of the switch control signal CTRL with the duty cycle Dset of the clock signal CLK, and generates a calibration code signal CAL_CODE to adjust circuit parameters of the on-time control circuit 203. By doing so, the on-time auto calibration comes true.

Once having been powered on for a predetermined time value (such as 200 uS), the switching converter enters into a normal operation mode. The multiplexers 208-210 respectively choose Vin, Vout and the comparison signal SET. In this mode, the calibration code signal CAL_CODE is kept unchanged. The on-time control circuit 203 generates the on-time control signal COT in accordance with the voltage Vin and Vout, while based on this on-time control signal COT and the comparison signal SET, the logic circuit 204 produces the switch control signal CTRL to alternatively turn on the transistors M1 and M2 through the driving circuit 207.

In practical applications, the voltage V1 might be a predetermined voltage generated inside IC. It could also be set as equal to the input voltage Vin. In the later situation, the multiplexer 208 could be omitted. As a synchronous BUCK topology is adopted in the switching converter of FIG. 3, the voltage V2 thereby could be configured as equal to the product of the voltage V1 and the predetermined duty cycle Dset. This means, if Dset is 50% and the voltage V1 is equal to the input voltage Vin, the voltage V2 could be expressed as 50%*Vin. People of ordinary skill in the art could understand, however, that this is not used to limit the present invention. The switching converter could incorporate any other suitable topologies, and the relationship between V1 and V2 is not necessarily confined by Dset.

Furthermore, it should be noted that the pulse generator 205 is also not indispensable. The clock signal CLK could be directly provided to the logic circuit 204 through the multiplexer 210 in the auto calibration mode. In addition, the signal provide to the on-time control circuit 203 by the multiplexer 209 in the normal operation mode can be the reference voltage Vref rather than the output voltage Vout.

Figure 4:
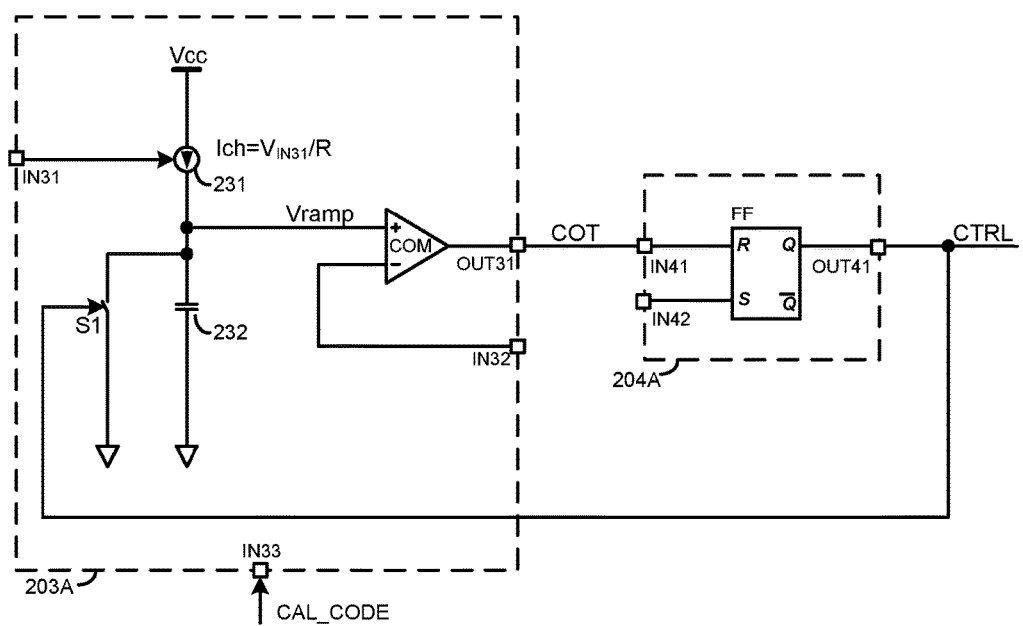
FIG. 4 schematically illustrates an on-time control circuit 203A and a logic circuit 204A in accordance with an embodiment of the present invention.

FIG. 4 schematically illustrates an on-time control circuit 203A and a logic circuit 204A in accordance with an embodiment of the present invention. The on-time control circuit 203A includes a controllable current source 231, a capacitor 232, a discharge transistor S1 and a comparator COM. The controllable current source 231 has a first terminal, a second terminal and a control terminal, wherein the first terminal is coupled to a power supply voltage Vcc, the control terminal is configured as the input terminal IN31 of the on-time control circuit. The controllable current source 231 is configured to provide a current Ich which is equal to the quotient between the voltage VIN31 at the control terminal and an equivalent resistance Re. The capacitor 232 has a first terminal and a second terminal, wherein the first terminal is coupled to the second terminal of the controllable current source 231, the second terminal is coupled to a reference ground. The discharge transistor S1 is coupled to the capacitor 232 in parallel and is controlled by the switch control signal CTRL. The comparator COM has a non-inverting input terminal, an inverting input terminal and an output terminal, wherein the non-inverting input terminal is coupled to the first terminal of the capacitor 232, the second input terminal is configured as the input terminal IN32 of the on-time control circuit, the output terminal is configured as the output terminal OUT31 of the on-time control circuit to provide the on-time control signal COT.

The logic circuit 204A includes a flip-flop FF which has a reset terminal R, a set terminal S and an output terminal Q respectively configured as terminals IN4, IN42 and OUT41 of the logic circuit.

In reference to the on-time control circuit 203A shown in FIG. 4, the circuit parameters adjusted by the calibration code signal CAL_CODE could probably include the equivalent resistance Re of the controllable current source 231 or the equivalent capacitance Ce of the capacitor 232.

Figure 5:
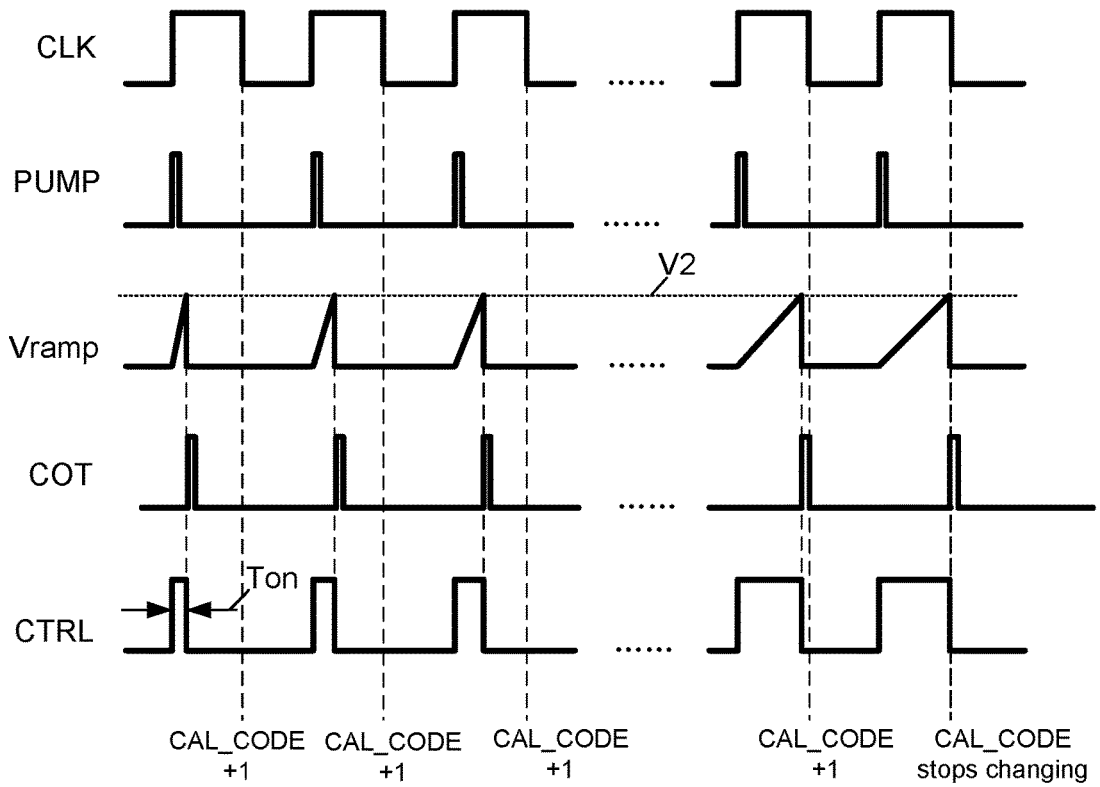
FIG. 5 illustrates working waveforms of the circuit shown in FIG. 4 in accordance with embodiments of the present invention during an auto calibration mode.

FIG. 5 illustrates working waveforms of the circuit shown in FIG. 4 in accordance with embodiments of the present invention during the auto calibration mode. In this mode, the voltage V1 and V2 are respectively provided to the input terminals IN31 and IN32 of the on-time control circuit 203A, and the pulse signal PUMP is provided to the input terminal IN42 of the logic circuit 204A. At the rising edge of the pulse signal PUMP, the flip-flop FF is set and the switch control signal CTRL is changed from logical low into logical high. The discharge transistor S1 is turned off, and the capacitor 232 is charged by the current Ich which could be expressed as:

$$Ich = \frac{V1}{Re} \quad (1)$$

Owing to the current Ich, the voltage Vramp across the capacitor 232 gradually rises up. Once the voltage Vramp increases to reach the voltage V2 at the inverting input terminal of the comparator COM, the on-time control signal COT is changed from logical low into logical high and the flip-flop FF is reset. The switch control signal CTRL is therefore turned from logical high into logical low, and the discharge transistor S1 is turned on to discharge the capacitor 232.

Based on the above analysis, the time period during which the switch control signal CTRL keeps high, which is known as the on-time Ton, could be expressed as:

$$Ton = \frac{V2 * Re * Ce}{V1} \quad (2)$$

The duty cycle D could be therefore expressed as:

$$D = \frac{Ton}{Tclk} = \frac{V2 * Re * Ce}{V1 * Tclk} \quad (3)$$

Tclk is indicative of the period of the clock signal CLK.

Generally, Ton is set to a relatively small value when the switch converter is powered on. Following that, the duty cycle D is compared with Dset in each clock period. And if the duty cycle D is detected to be smaller than Dset, the calibration code signal CAL_CODE will be adjusted by one LSB to enlarge the equivalent resistance Re or the equivalent capacitance Ce, so as to increase the duty cycle D. By doing so, the duty cycle D gradually rises up until it reaches Dset. Because of resolution, the duty cycle D could eventually be equal to or slightly larger than Dset.

Theoretically speaking, once the auto calibration is successfully done, Ton could be expressed as:

$$Ton = Tclk * Dset \quad (4)$$

Combing equations (2) and (4), we can get:

$$Re * Ce = Tclk * Dset * \frac{V1}{V2} \quad (5)$$

Figure 6:
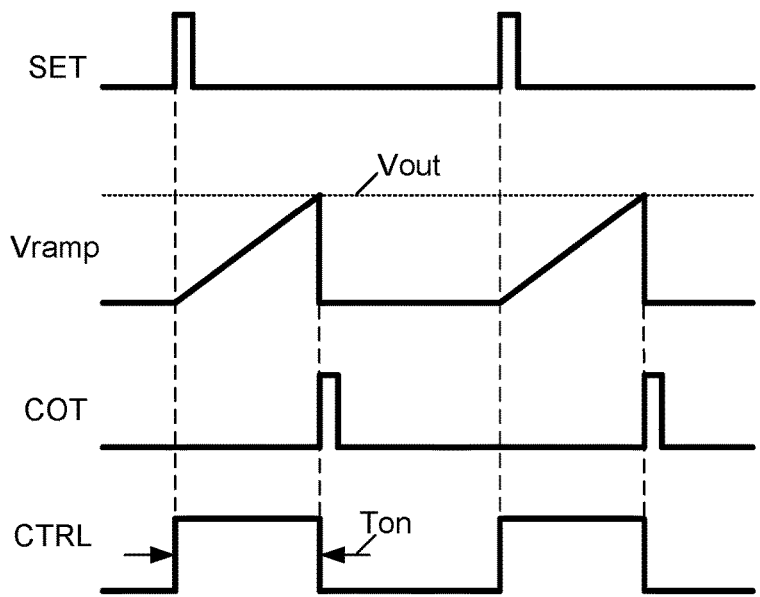
FIG. 6 illustrates working waveforms of the circuit shown in FIG. 4 in accordance with embodiments of the present invention during a normal operation mode.

FIG. 6 illustrates working waveforms of the circuit shown in FIG. 4 in accordance with embodiments of the present invention during the normal operation mode. In normal operation, the voltage Vin and Vout are respectively provided to the input terminals IN31 and IN32 of the on-time control circuit 203A, and the comparison signal SET is provided to the input terminal IN42 of the logic circuit 204A. The calibration code signal CAL_CODE is maintained, so both the equivalent resistance Re and the equivalent capacitance Ce are kept unchanged.

In this mode, Ich could be expressed as:

$$Ich = \frac{Vin}{Re} \quad (6)$$

Accordingly, the on-time Ton could be expressed as:

$$Ton = \frac{Vout * Re * Ce}{Vin} = \frac{Vout}{Vin} * Tclk * Dset * \frac{V1}{V2} \quad (7)$$

If we choose $$V2 = Dset * V1 \quad (8)$$

Then the equation (7) could be simplified as:

$$Ton = \frac{Vout}{Vin} * Tclk \quad (9)$$

It can be seen from the equation (9) that the on-time Ton in normal operation is no longer influenced by manufacture tolerance. Since Tclk could be precisely set without deviation, the on-time Ton will be the same as long as the input voltage Vin and output voltage Vout are not changed.

Figure 7:
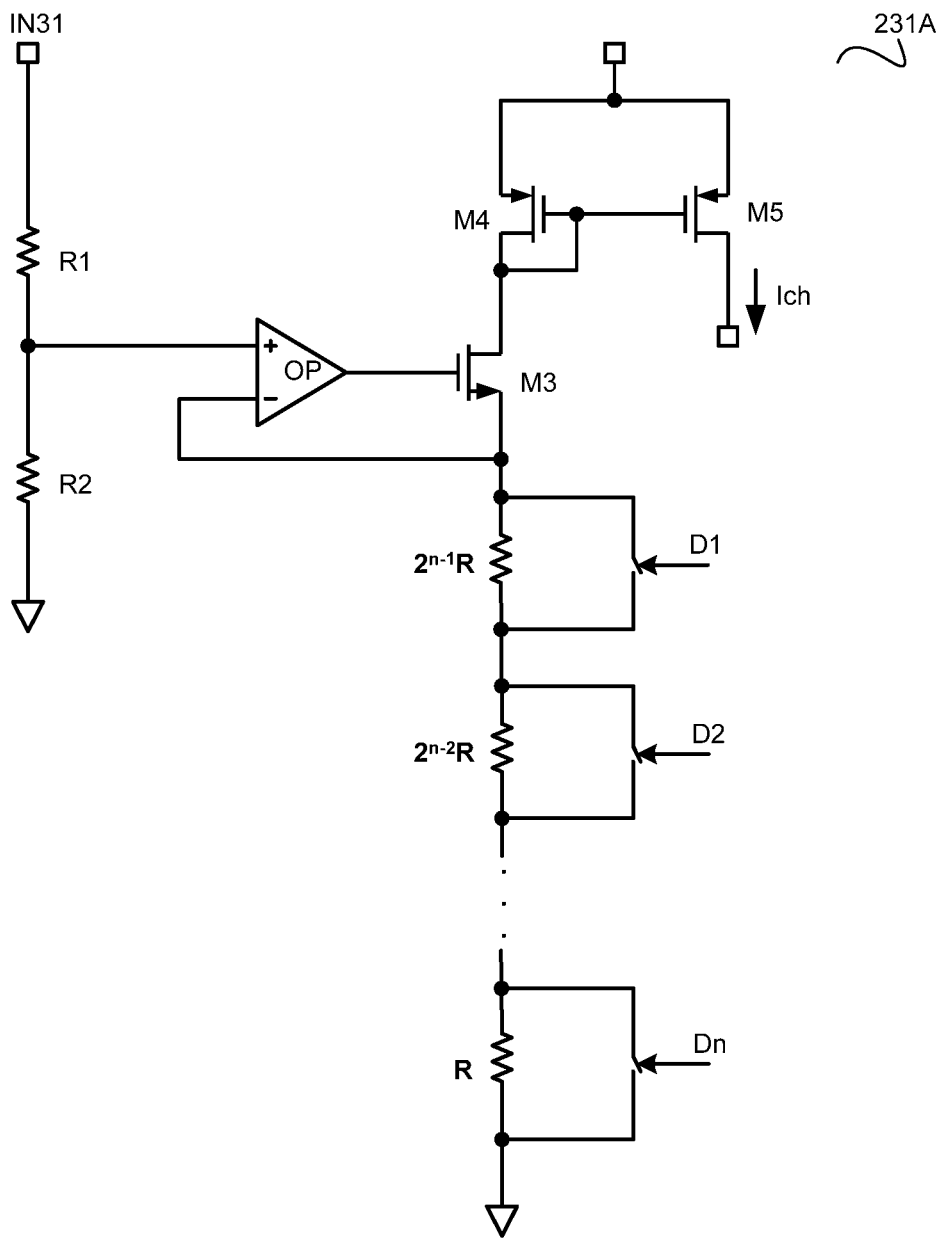
FIG. 7 schematically illustrates a controllable current source 231A in accordance with an embodiment of the present invention.
Figure 8:
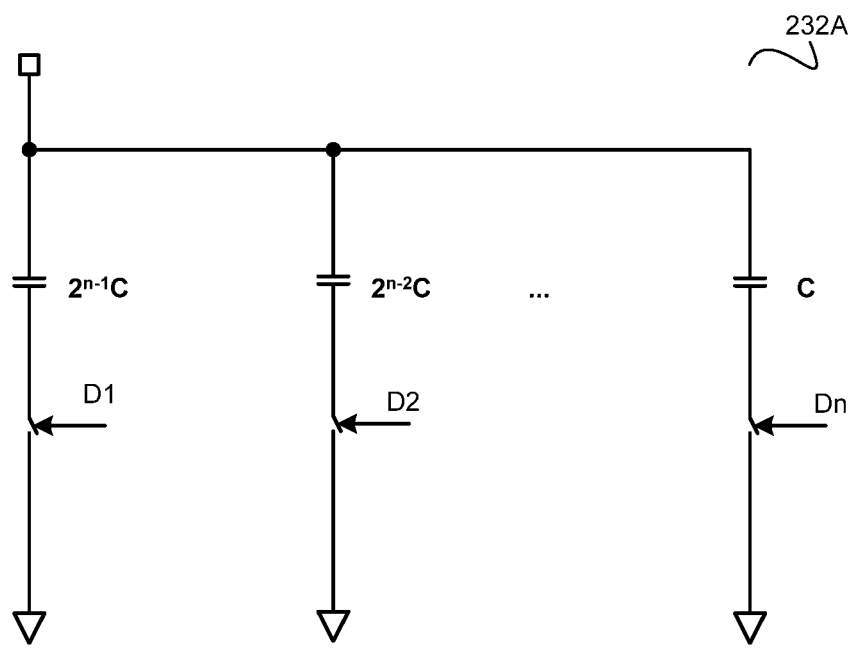
FIG. 8 schematically illustrates a capacitor 232A in accordance with an embodiment of the present invention.

The adjustment of Re or Ce can be realized by various ways, wherein two of them are disclosed by FIGS. 7 and 8 without the intention of limiting the scope of the present invention.

FIG. 7 schematically illustrates a controllable current source 231A in accordance with an embodiment of the present invention. It includes a resistor divider consisted of resistors R1 and R2, a current mirror formed by transistors M4 and M5, an operational amplifier OP, a transistor M3 and a plurality of serially connected branches. Each of the branches has a transistor controlled by the calibration code signal CAL_CODE and a resistor connected to the transistor in parallel.

In the embodiment shown in FIG. 7, the calibration code signal CAL_CODE is a digital signal with n bits and is expressed as [D1, D2, ..., Dn]. The controllable current source 231A includes n serially connected branches, wherein the transistors in these branches are respectively controlled by D1, D2, ..., Dn, and the resistors have resistance respectively configured as $2^{n-1}R, 2^{n-2}R, ..., R$. Based on the structure shown in FIG. 7, it can be concluded that:

$$Ich = \frac{V_{IN31} * \frac{R2}{R1+R2}}{D1*2^{n-1}R + D2*2^{n-2}R + ... + Dn*R} \quad (10)$$

In other words, the equivalent resistance Re could be expressed as:

$$Re = (D1*2^{n-1} + D2*2^{n-2} + ... + Dn) * R * \frac{R1+R2}{R2} \quad (11)$$

FIG. 8 schematically illustrates a capacitor 232A in accordance with an embodiment of the present invention. It includes a plurality of branches connected in parallel. Each of the branches has a transistor controlled by the calibration code signal CAL_CODE and a capacitor connected to the transistor in serial.

In the embodiment shown in FIG. 8, the transistors in those parallel-connected branches are respectively controlled by D1, D2, ..., Dn, and the capacitors have capacitance respectively configured as $2^{n-1}C, 2^{n-2}C, ..., C$. Based on the structure shown in FIG. 8, it can be concluded that:

$$Ce(D1*2^{n-1} + D2*2^{n-2} + ... + Dn)*C \quad (12)$$

Figure 9:
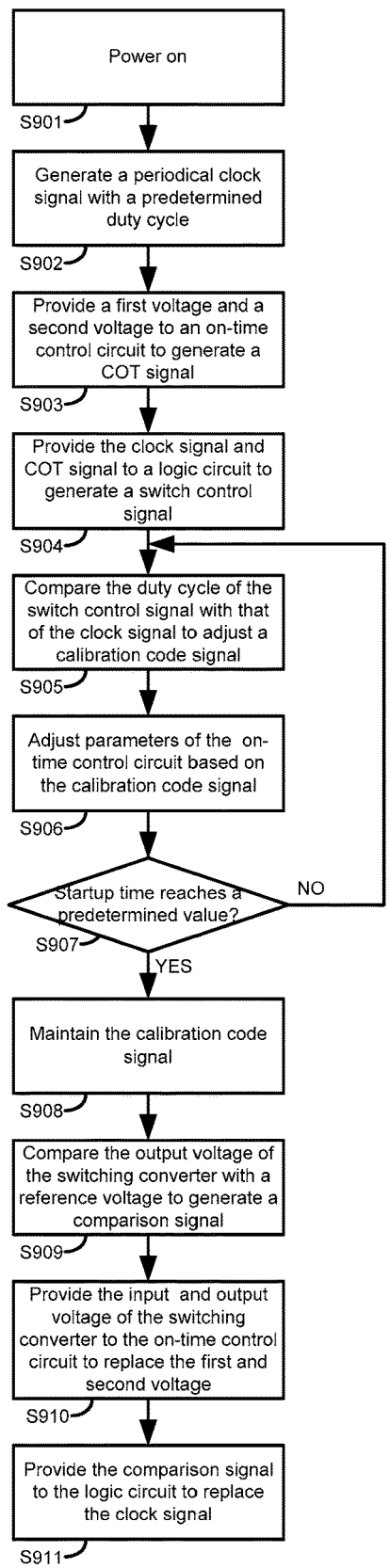
FIG. 9 illustrates a flow chart of a method for controlling a switching converter in accordance with an embodiment of the present invention.

FIG. 9 illustrates a flow chart of a method for controlling a switching converter in accordance with an embodiment of the present invention. It comprises steps S901~S911.

At step S901, the switching converter is powered on. And then at step S902, a periodical clock signal CLK with a predetermined duty cycle Dset is generated.

At step S903, a first voltage V1 and a second voltage V2 are provided to an on-time control circuit to generate an on-time control signal COT based on the voltage V1 and V2. In some embodiments, the second voltage V2 is set as equal to the product of the first voltage V1 and the predetermined duty cycle Dset.

At step S904, the clock signal CLK and on-time control signal COT are provided to a logic circuit to generate a switch control signal CTRL based thereupon.

At step S905, the duty cycle D of the switch control signal CTRL is compared with Dset to adjust a calibration code signal CAL_CODE.

At step S906, circuit parameters, such as capacitance or resistance, of the on-time control circuit are adjusted in accordance with the calibration code signal CAL_CODE.

At step S907, whether the switching converter has been powered on for a predetermined time value (e.g. 200 uS) is detected. If the switching converter has been powered on for 200 uS, the method will proceed to step S908, otherwise, it will goes back to step S905.

As step S908, the calibration signal CAL_CODE is maintained and the circuit parameters of the on-time control circuit are kept unchanged.

At step S909, the output voltage Vout of the switching converter is compared with a reference voltage Vref to generate a comparison signal SET.

As step S910, the input Vin and output voltage Vout of the switching converter are provided to the on-time control circuit to replace the voltage V1 and V2.

At step S911, the comparison signal SET is sent to the logic circuit to replace the clock signal CLK.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. An auto calibration method used in switching converters with constant on-time control, wherein the switching converter is configured to convert an input voltage into an output voltage, and is configured to include a main transistor, an on-time control circuit determining the on-time of the main transistor, and a logic circuit driving the main transistor, the auto calibration method comprises:
    generating a periodical clock signal with a predetermined duty cycle;
    providing a first voltage and a second voltage to the on-time control circuit to generate an on-time control signal based on the first and second voltage;
    providing the clock signal and on-time control signal to the logic circuit to generate a switch control signal based on the clock signal and on-time control signal;
    comparing the duty cycle of the switch control signal with the duty cycle of the clock signal to adjust a calibration code signal; and
    adjusting circuit parameters of the on-time control circuit in accordance with the calibration code signal.

2. The auto calibration method of claim 1, further comprising:
    comparing the output voltage of the switching converter with a reference voltage to generate a comparison signal;
    determining whether the switching converter has been powered on for a predetermined time value; and
    when the predetermined time value is reached, stopping the adjustment of the calibration code signal, providing the input and output voltage of the switching converter to the on-time control circuit to replace the first and second voltage, and providing the comparison signal to the logic circuit to replace the clock signal.

3. The auto calibration method of claim 1, wherein the duty cycle of the switch control signal is compared with the duty cycle of the clock signal in each period of the clock signal, and the calibration code signal will be adjusted by one least significant bit to increase the duty cycle of the switch control signal if the duty cycle of the switch control signal is detected to be smaller than the duty cycle of the clock signal.

4. The auto calibration method of claim 1, wherein the first voltage is equal to the input voltage.

5. The auto calibration method of claim 1, wherein the on-time control circuit has a controllable current source and a capacitor, and the circuit parameters adjusted by the calibration code signal includes the equivalent resistance of the controllable current source or the equivalent capacitance of the capacitor.

6. The auto calibration method of claim 1, wherein the second voltage is equal to the product of the first voltage and the predetermined duty cycle.

7. The auto calibration method of claim 1, wherein the switch control signal is turned into logical high at the rising edge of the clock signal, and is turned into logical low at the rising edge of the on-time control signal.

8. A controller used in a switching converter with constant on-time control, wherein the switching converter includes a main transistor, and is configured to convert an input voltage into an output voltage, the controller comprises:
    an oscillator configured to generate a periodical clock signal with a predetermined duty cycle;
    an on-time control circuit having a first input terminal, a second input terminal, a third input terminal and an output terminal, wherein the first input terminal is configured to receive a first voltage, the second input terminal is configured to receive a second voltage, and wherein based on the first and second voltage, the on-time control circuit generates an on-time control signal at the output terminal to determine the on-time of the main transistor;
    a logic circuit having a first input terminal, a second input terminal and an output terminal, wherein the first input terminal is coupled to the output terminal of the on-time control circuit, the second input terminal is coupled to the oscillator to receive the clock signal, and wherein based on the on-time control signal and the clock signal, the logic circuit generates a switch control signal at the output terminal to drive the main transistor; and
    a duty cycle detection circuit having a first input terminal, a second input terminal and an output terminal, wherein the first input terminal is coupled to the oscillator, the second input terminal is coupled to the output terminal of the logic circuit, the output terminal is coupled to the third input terminal of the on-time control circuit, and wherein the duty cycle detection circuit compares the duty cycle of the switch control signal with the duty cycle of the clock signal, and generates a calibration code signal at the output terminal to adjust circuit parameters of the on-time control circuit.

9. The controller of claim 8, wherein the duty cycle detection circuit compares the duty cycle of the switch control signal with the duty cycle of the clock signal in each period of the clock signal, and the calibration code signal will be adjusted by one least significant bit to increase the duty cycle of the switch control signal if the duty cycle of the switch control signal is detected to be smaller than the duty cycle of the clock signal.

10. The controller of claim 8, further comprising:
    a comparing circuit configured to compare the output voltage of the switching converter with a reference voltage to generate a comparison signal; wherein
    once the switching converter has been powered on for a predetermined time value, the input and output voltage of the switching converter are provided to the on-time control circuit to replace the first and second voltage, the comparison signal is provided to the logic circuit to replace the clock signal, and the calibration code signal is maintained.

11. The controller of claim 8, wherein the first voltage is equal to the input voltage.

12. The controller of claim 8, wherein the on-time control circuit comprises:
  a controllable current source having a first terminal, a second terminal and a control terminal, wherein the first terminal is coupled to a power supply voltage, the control terminal is configured as the first input terminal of the on-time control circuit, and wherein the controllable current source is configured to provide a current which is equal to the quotient between the voltage at the control terminal and an equivalent resistance;
  a capacitor having a first terminal and a second terminal, wherein the first terminal is coupled to the second terminal of the controllable current source, the second terminal is coupled to a reference ground;
  a discharge transistor coupled to the capacitor in parallel and controlled by the switch control signal; and
  a comparator having a first input terminal, a second input terminal and an output terminal, wherein the first input terminal is coupled to the first terminal of the capacitor, the second input terminal is configured as the second input terminal of the on-time control circuit, the output terminal is configured as the output terminal of the on-time control circuit to provide the on-time control signal; wherein
  the circuit parameters adjusted by the calibration code signal includes the equivalent resistance of the controllable current source or the equivalent capacitance of the capacitor.

13. The controller of claim 8, wherein the second voltage is equal to the product of the first voltage and the predetermined duty cycle.

14. The controller of claim 8, further comprising:
  a pulse generator having an input terminal and an output terminal, wherein the input terminal is coupled to the oscillator to receive the clock signal, the output terminal is coupled to the second input terminal of the logic circuit, and wherein based on the clock signal, the pulse generator generates a pulse signal synchronous with the clock signal.

15. A switching converter with constant on-time control, comprising:
  a first transistor having a first terminal, a second terminal and a control terminal, wherein the first terminal is configured to receive an input voltage;
  a second transistor having a first terminal, a second terminal and a control terminal, wherein the first terminal is coupled to the second terminal of the first transistor, the second terminal is coupled to a reference ground;
  an inductor having a first terminal and a second terminal, wherein the first terminal is coupled to the second terminal of the first transistor and the first terminal of the second transistor, the second terminal is configured to provide an output voltage;
  an oscillator configured to generate a periodical clock signal with a predetermined duty cycle;
  an on-time control circuit having a first input terminal, a second input terminal, a third input terminal and an output terminal, wherein the first input terminal is configured to receive a first voltage, the second input terminal is configured to receive a second voltage, and wherein based on the first and second voltage, the on-time control circuit generates an on-time control signal at the output terminal;
  a logic circuit coupled to the oscillator and the output terminal of the on-time control circuit, wherein based on the on-time control signal and the clock signal, the logic circuit generates a switch control signal drive the first and second transistors; and
  a duty cycle detection circuit coupled to the oscillator, the logic circuit and the third input terminal of the on-time control circuit, wherein the duty cycle detection circuit compares the duty cycle of the switch control signal with the duty cycle of the clock signal, and generates a calibration code signal to adjust circuit parameters of the on-time control circuit.

16. The switching converter of claim 15, wherein the duty cycle detection circuit compares the duty cycle of the switch control signal with the duty cycle of the clock signal in each period of the clock signal, and the calibration code signal will be adjusted by one least significant bit to increase the duty cycle of the switch control signal if the duty cycle of the switch control signal is detected to be smaller than the duty cycle of the clock signal.

17. The switching converter of claim 15, further comprising:
  a comparing circuit configured to compare the output voltage of the switching converter with a reference voltage to generate a comparison signal; wherein
  once the switching converter has been powered on for a predetermined time value, the input and output voltage of the switching converter are provided to the on-time control circuit to replace the first and second voltage, the comparison signal is provided to the logic circuit to replace the clock signal, and the calibration code signal is maintained.

18. The switching converter of claim 15, wherein the first voltage is equal to the input voltage.

19. The switching converter of claim 15, wherein the on-time control circuit comprises:
  a controllable current source having a first terminal, a second terminal and a control terminal, wherein the first terminal is coupled to a power supply voltage, the control terminal is configured as the first input terminal of the on-time control circuit, and wherein the controllable current source is configured to provide a current which is equal to the quotient between the voltage at the control terminal and an equivalent resistance;
  a capacitor having a first terminal and a second terminal, wherein the first terminal is coupled to the second terminal of the controllable current source, the second terminal is coupled to a reference ground;
  a discharge transistor coupled to the capacitor in parallel and controlled by the switch control signal; and
  a comparator having a first input terminal, a second input terminal and an output terminal, wherein the first input terminal is coupled to the first terminal of the capacitor, the second input terminal is configured as the second input terminal of the on-time control circuit, the output terminal is configured as the output terminal of the on-time control circuit to provide the on-time control signal; wherein
  the parameters adjusted by the calibration code signal includes the equivalent resistance of the controllable current source or the equivalent capacitance of the capacitor.

20. The switching converter of claim 15, wherein the second voltage is equal to the product of the first voltage and the predetermined duty cycle.

* * * * *